United States Patent
Fujisaki

(10) Patent No.: US 8,325,547 B2
(45) Date of Patent: Dec. 4, 2012

(54) TEST APPARATUS AND REPAIR ANALYSIS METHOD

(75) Inventor: Kenichi Fujisaki, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/298,207

(22) Filed: Nov. 16, 2011

(65) Prior Publication Data

US 2012/0120748 A1    May 17, 2012

Related U.S. Application Data

(63) Continuation of application No. PCT/JP2009/003271, filed on Jul. 13, 2009.

(51) Int. Cl.
*G11C 29/00* (2006.01)

(52) U.S. Cl. .................. 365/200; 365/201; 324/762.01; 714/718

(58) Field of Classification Search .................. None
See application file for complete search history.

(56) References Cited

U.S. PATENT DOCUMENTS

| | | | | |
|---|---|---|---|---|
| 5,831,989 A * | 11/1998 | Fujisaki | | 714/723 |
| 6,594,788 B1 * | 7/2003 | Yasui | | 714/710 |
| 7,733,721 B2 * | 6/2010 | Tabata | | 365/201 |
| 8,074,130 B2 * | 12/2011 | Sato | | 714/723 |

FOREIGN PATENT DOCUMENTS

| | | |
|---|---|---|
| JP | H10-92195 A | 4/1998 |
| JP | 2000-123595 A | 4/2000 |
| JP | 2005-259266 A | 9/2005 |

OTHER PUBLICATIONS

"Notification of Reasons for Refusal" Issued by the Japanese Patent Office on Jul. 3, 2012 for patent application No. 2011-522619 (counterpart of U.S. Appl. No. 13/298,207) and accompanying (machine translation) Google Translation in English.

International Search Report for International application PCT/JP2009/003271 mailed on Nov. 2, 2009.

Written Opinion International Application No. PCT/JP2009/003271 mailed on Feb. 16, 2012.

* cited by examiner

*Primary Examiner* — Tan T. Nguyen
(74) *Attorney, Agent, or Firm* — Ryuka

(57) ABSTRACT

A test apparatus that tests a memory under test, comprising an address fail memory that stores address fail data for each address; a block fail memory that stores block fail data for each block; a reading section that reads the address fail data from the address fail memory for each block; a row fail counter that, for each row address in a group including a plurality of the blocks in the memory under test, counts the fail cells indicated by the address fail data; and a column fail counter that counts the fails cells for each column address.

11 Claims, 11 Drawing Sheets

FIG. 6

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| Y11 | Y10 | Y9 | Y8 | Y7 | Y6 | Y5 | Y4 | Y3 | Y2 | Y1 | Y0 | X11 | X10 | X9 | X8 | X7 | X6 | X5 | X4 | X3 | X2 | X1 | X0 |

AFM_Address

| 9 | 8 | 7 | 6 | 5 | 4 | 3 | 2 | 1 | 0 |
|---|---|---|---|---|---|---|---|---|---|
| Y11 | Y10 | Y9 | Y8 | Y7 | X11 | X10 | X9 | X8 | X7 |

BFM_Address

WHEN TESTING THE DUT

|  | 9 | 8 | 7 | 6 | 5 | 4 | 3 | 2 | 1 | 0 |
|---|---|---|---|---|---|---|---|---|---|---|
| Register_A | D9 | D8 | D7 | D6 | D5 | D4 | D3 | D2 | D1 | D0 |

|  | 9 | 8 | 7 | 6 | 5 | 4 | 3 | 2 | 1 | 0 |
|---|---|---|---|---|---|---|---|---|---|---|
| BAP | B9 | B8 | B7 | B6 | B5 | B4 | B3 | B2 | B1 | B0 |

|  | 11 | 10 | 9 | 8 | 7 | 6 | 5 | 4 | 3 | 2 | 1 | 0 |
|---|---|---|---|---|---|---|---|---|---|---|---|---|
| RAP | R11 | R10 | R9 | R8 | R7 | R6 | R5 | R4 | R3 | R2 | R1 | R0 |

|  | 11 | 10 | 9 | 8 | 7 | 6 | 5 | 4 | 3 | 2 | 1 | 0 |
|---|---|---|---|---|---|---|---|---|---|---|---|---|
| CAP | C11 | C10 | C9 | C8 | C7 | C6 | C5 | C4 | C3 | C2 | C1 | C0 |

|  | 11 | 10 | 9 | 8 | 7 | 6 | 5 | 4 | 3 | 2 | 1 | 0 |
|---|---|---|---|---|---|---|---|---|---|---|---|---|
| ROW CARRY SELECTOR | 0 | 0 | 0 | 0 | 0 | 1 | 1 | 1 | 1 | 1 | 1 | 1 |

|  | 11 | 10 | 9 | 8 | 7 | 6 | 5 | 4 | 3 | 2 | 1 | 0 |
|---|---|---|---|---|---|---|---|---|---|---|---|---|
| COLUMN CARRY SELECTOR | 0 | 0 | 0 | 0 | 0 | 1 | 1 | 1 | 1 | 1 | 1 | 1 |

|  | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| RFC_Address | B6 | B5 | B4 | B3 | B2 | B1 | B0 | R6 | R5 | R4 | R3 | R2 | R1 | R0 |

|  | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| CFC_Address | B6 | B5 | B4 | B3 | B2 | B1 | B0 | C6 | C5 | C4 | C3 | C2 | C1 | C0 |

|  | 9 | 8 | 7 | 6 | 5 | 4 | 3 | 2 | 1 | 0 |
|---|---|---|---|---|---|---|---|---|---|---|
| TFC_Address (BAP) |  |  |  | B6 | B5 | B4 | B3 | B2 | B1 | B0 |

*FIG. 8*

|  | 9 | 8 | 7 | 6 | 5 | 4 | 3 | 2 | 1 | 0 |
|---|---|---|---|---|---|---|---|---|---|---|
| BFM_Address | D1 | B7 | B6 | B5 | B4 | D0 | B3 | B2 | B1 | B0 |

|  | 9 | 8 | 7 | 6 | 5 | 4 | 3 | 2 | 1 | 0 |
|---|---|---|---|---|---|---|---|---|---|---|
| Register_A | D9 | D8 | D7 | D6 | D5 | D4 | D3 | D2 | D1 | D0 |

|  | 9 | 8 | 7 | 6 | 5 | 4 | 3 | 2 | 1 | 0 |
|---|---|---|---|---|---|---|---|---|---|---|
| BAP | B9 | B8 | B7 | B6 | B5 | B4 | B3 | B2 | B1 | B0 |

|  | 11 | 10 | 9 | 8 | 7 | 6 | 5 | 4 | 3 | 2 | 1 | 0 |
|---|---|---|---|---|---|---|---|---|---|---|---|---|
| RAP | R11 | R10 | R9 | R8 | R7 | R6 | R5 | R4 | R3 | R2 | R1 | R0 |

|  | 11 | 10 | 9 | 8 | 7 | 6 | 5 | 4 | 3 | 2 | 1 | 0 |
|---|---|---|---|---|---|---|---|---|---|---|---|---|
| CAP | C11 | C10 | C9 | C8 | C7 | C6 | C5 | C4 | C3 | C2 | C1 | C0 |

|  | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| RFC_Address | B7 | B6 | B5 | B4 | B3 | B2 | B1 | B0 | R5 | R4 | R3 | R2 | R1 | R0 |

|  | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| CFC_Address | B7 | B6 | B5 | B4 | B3 | B2 | B1 | B0 | C5 | C4 | C3 | C2 | C1 | C0 |

|  | 9 | 8 | 7 | 6 | 5 | 4 | 3 | 2 | 1 | 0 |
|---|---|---|---|---|---|---|---|---|---|---|
| TFC_Address (BAP) |  |  | B7 | B6 | B5 | B4 | B3 | B2 | B1 | B0 |

*FIG. 9*

TEST APPARATUS AND REPAIR ANALYSIS METHOD

BACKGROUND

1. Technical Field

The present invention relates to a test apparatus for testing a memory and to a repair analysis method.

2. Related Art

A test apparatus that tests a memory writes prescribed data to the memory under test, reads the written data, and compares the read data to an expected value. Furthermore, the test apparatus writes fail data, which indicates that the read data does not match the expected value, to an address fail memory (AFM). The test apparatus performs a repair analysis of the memory under test based on the fail data written to the AFM, as shown in Patent Document 1, for example.

Patent Document 1: Japanese Patent Application Publication No. 2005-259266

Here, when performing the repair analysis, the test apparatus sequentially reads the fail data from the AFM and counts the number of fail cells (RFC) for each row address and the number of fail cells (CFC) for each column address in the memory under test. The counting process for obtaining the RFC and the CFC is preferably performed quickly in order to shorten the repair analysis time between tests and improve the overall throughput. Accordingly, the test apparatus is preferably formed using a high-speed memory, such as an SRAM, as the counter circuit for obtaining the RFC and the CFC.

In recent years, however, the capacity of the memory under test has increased. Accordingly, the test apparatus must have larger memory capacity for storing the RFC and the CFC, according to the capacity of the memory under test.

However, a high-capacity SRAM is expensive and difficult to obtain. Accordingly, a test apparatus in which the memory capacity is increased to store the RFC and the CFC is more expensive.

SUMMARY

Therefore, in order to solve the above problem, according to a first aspect related to the innovations herein, provided is a test apparatus that tests a memory under test, comprising an address fail memory that, for each address in the memory under test, stores address fail data indicating whether a fail cell is contained at the address; a block fail memory that, for each block including a plurality of cells of the memory under test, stores block fail data indicating whether a fail cell is contained in the block; a reading section that, for each block in the memory under test, reads the address fail data from the address fail memory; a row fail counter that, for each row address in a group including a plurality of the blocks in the memory under test, counts the fail cells indicated by the address fail data read by the reading section; and a column fail counter that, for each column address in the group, counts the fails cells indicated by the address fail data read by the reading section.

The summary clause does not necessarily describe all necessary features of the embodiments of the present invention. The present invention may also be a sub-combination of the features described above.

BRIEF DESCRIPTION OF THE DRAWINGS

FIG. 6 shows exemplary addresses supplies to the address fail memory 30 and the block fail memory 40 during testing of the DUT.

FIG. 8 shows an exemplary setting when there are 7 row address bits and 7 column address bits in a block.

FIG. 9 shows an exemplary setting when there are 6 row address bits and 6 column address bits in a block.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
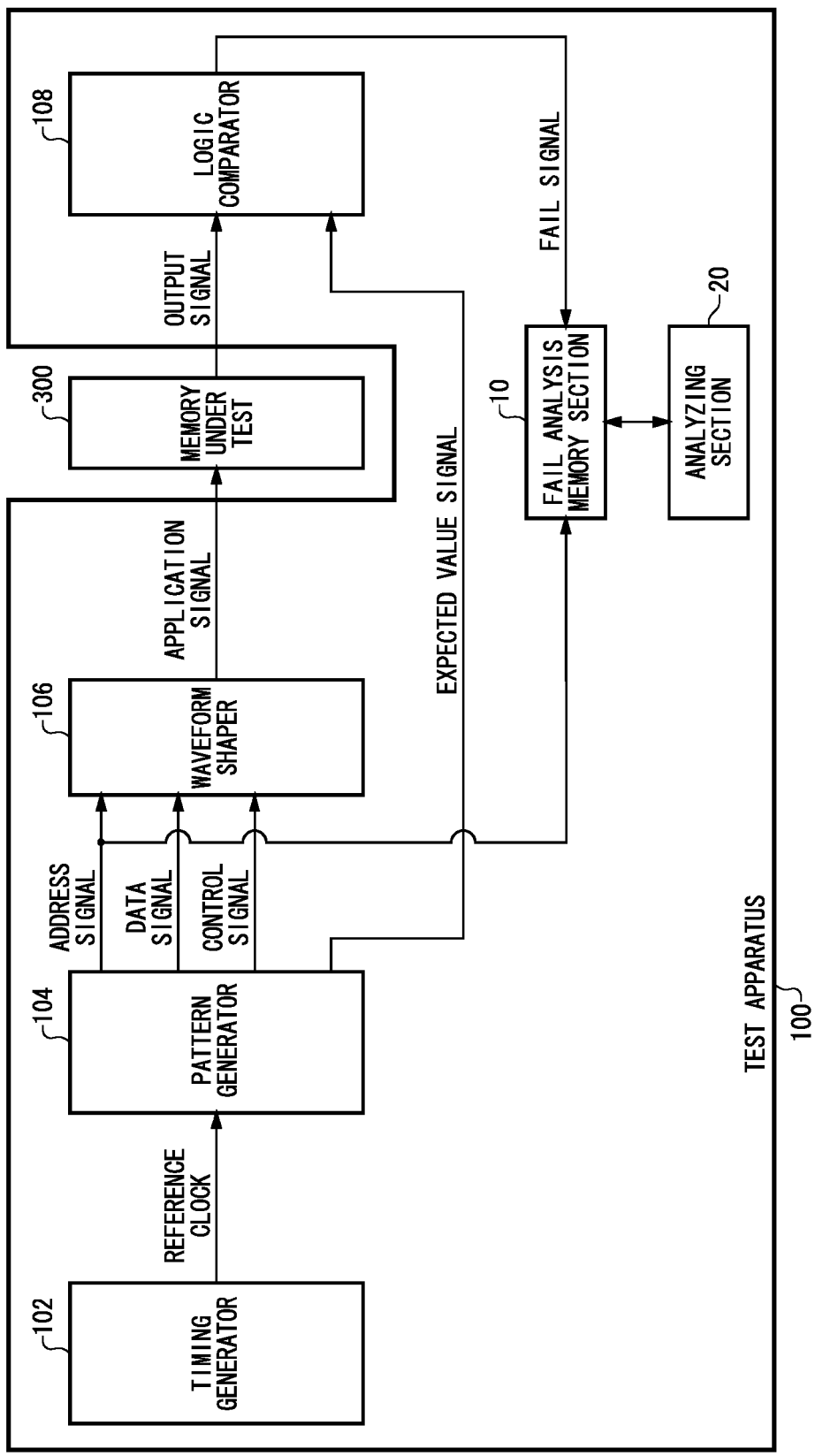
FIG. 1 shows a configuration of a test apparatus 100 according to an embodiment of the present invention, along with a memory under test 300.

FIG. 1 shows a configuration of a test apparatus 100 according to an embodiment of the present invention, along with a memory under test 300. The test apparatus 100 of the present embodiment tests the memory under test 300 and detects fail cells. Furthermore, the test apparatus 100 performs a repair analysis to make the memory under test 300 an acceptable article, by electrically replacing address lines containing fail cells with spare lines.

The test apparatus 100 includes a timing generator 102, a pattern generator 104, a waveform shaper 106, a logical comparator 108, a fail analysis memory section 10, and an analyzing section 20. The timing generator 102 generates a reference clock and supplies the reference clock to the pattern generator 104.

The pattern generator 104 generates an address signal, a data signal, and a control signal to be supplied to the memory under test 300, based on the reference clock, and supplies the generated signals to the waveform shaper 106. The pattern generator 104 generates an expected value signal expected to be output by the memory under test 300, and supplies the expected value signal to the logical comparator 108. The waveform shaper 106 forms an application signal based on the address signal, the data signal, and the control signal, and supplies the application signal to the memory under test 300.

The logical comparator 108 compares the output signal output by the memory under test 300 in response to the application signal to the expected value signal generated by the pattern generator 104. When the output signal does not match the expected value signal, the logical comparator 108 outputs a fail signal indicating a fail.

The fail analysis memory section 10 stores the fail signal generated by the logical comparator 108, in association with the address indicated by the address signal generated by the pattern generator 104. In this way, the fail analysis memory section 10 can store fail data indicating the position of a fail cell in a memory region within the memory under test 300. The configuration of the fail analysis memory section 10 is described in detail in FIG. 2.

When a fail cell is detected during testing of the memory under test 300, the analyzing section 20 reads the fail data stored in the fail analysis memory section 10 and performs the fail analysis on the memory under test 300. Specifically, the analyzing section 20 analyzes whether the memory under test 300 can be made an acceptable article by replacing the row address lines and column address lines containing fail cells in the memory under test 300 with spare lines for row addresses and spare lines for column addresses. The configuration of the analyzing section 20 is described in detail from FIG. 3 onward.

The test apparatus 100 tests the memory under test 300 and stores the test results as fail data in the fail analysis memory section 10. After testing, the test apparatus 100 performs the repair analysis on the memory under test 300 if a fail cell was detected during testing of the memory under test 300.

The memory region of the memory under test 300 is divided into a large number of repair blocks, sometimes referred to simply as "blocks." Each block is formed by memory cells that are accessed and arranged in two dimensions as a plurality of row address lines and a plurality of column address lines.

The test apparatus 100 according to the present embodiment performs the repair analysis for all of the blocks in the memory under test 300, in units of groups each including a plurality of blocks. More specifically, the test apparatus 100 reads the fail data stored in the fail analysis memory section 10 for each group, and counts the number of fail cells in each row address (RFC) in the group, the number of fail cells in each column address (CFC) in the group, and the total number of fail cells (TFC) in each block in the group.

The test apparatus 100 performs the repair process on the memory under test 300 for each group, based on the number of fail cells in each row address (RFC) in the group, the number of fail cells in each column address (CFC) in the group, and the total number of fail cells (TFC) in each block in the group. Depending on the repair analysis method, the test apparatus 100 does not necessarily need to count the total number of fail cells (TFC) in each block in the group.

Figure 2:
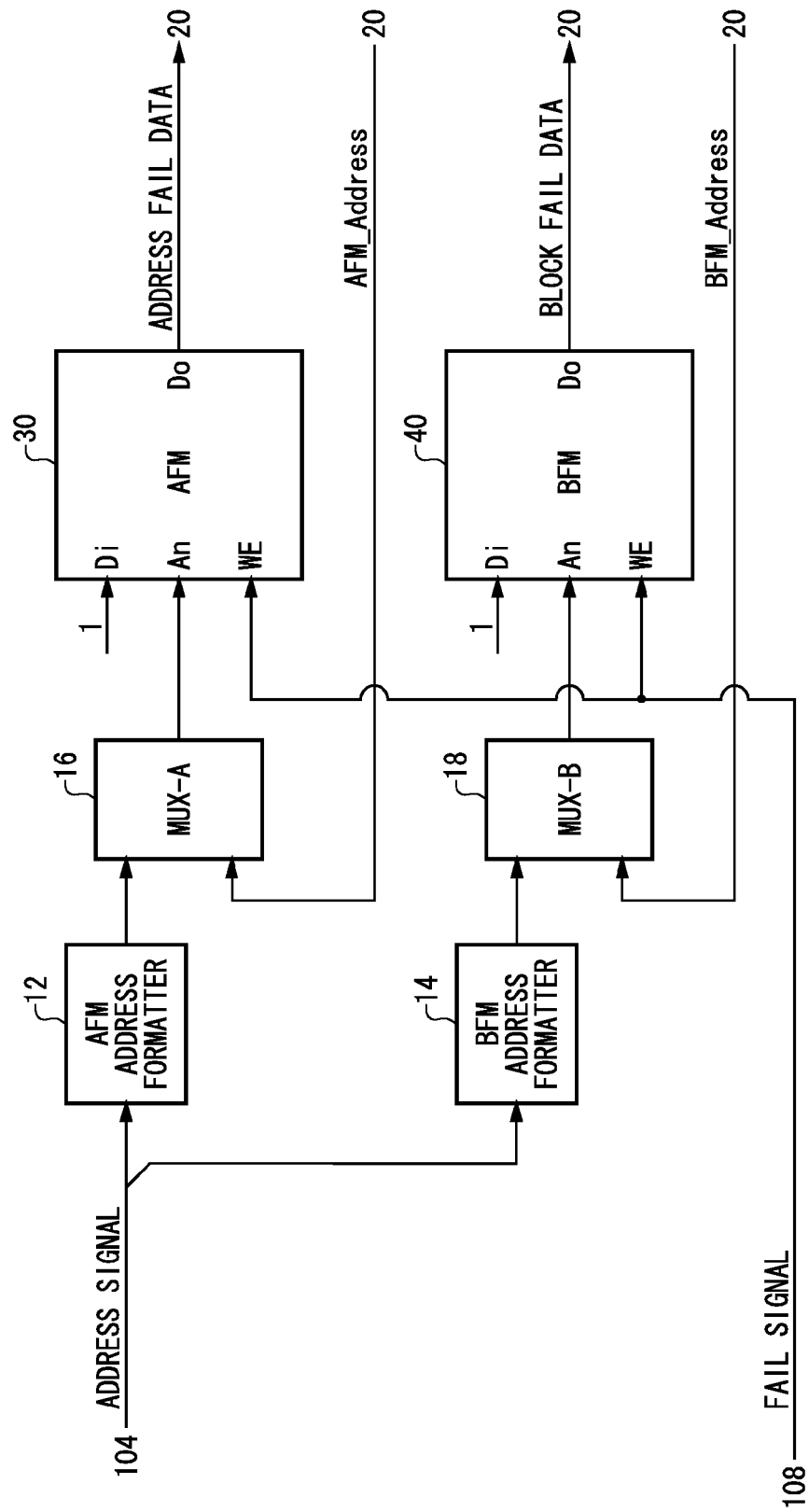
FIG. 2 shows a configuration of the fail analysis memory section 10 according to the present embodiment.

FIG. 2 shows a configuration of the fail analysis memory section 10 according to the present embodiment. The fail analysis memory section 10 includes an address fail memory (AFM) 30, a block fail memory (BFM) 40, an AFM address formatter 12, a BFM address formatter 14, an AFM address selector (MUX-A) 16, and a BFM address selector (MUX-B) 18.

The address fail memory 30 includes a memory region with the same address configuration as the memory under test 300. The address fail memory 30 stores address fail data indicating whether a fail cell is present, for each address in the memory under test 300.

The block fail memory 40 includes a memory region having an address configuration that is the same as the block configuration obtained by dividing the memory region within the memory under test 300. The block fail memory 40 stores block fail data indicating whether fail cells are present, for each block within the memory under test 300.

The AFM address formatter 12 converts the address signal generated by the pattern generator 104 into an address (AFM_Address) that is provided to the address fail memory 30. Specifically, the AFM address formatter 12 formats the address signal from the pattern generator 104 to be an address of the address fail memory 30 such that the address signal corresponds to the addresses of the memory under test 300, and outputs the address in this format. With this formatting function, the address fail memory 30 can be made to correspond to memories under test 300 with a variety of address configurations.

The BFM address formatter 14 converts the address signal generated by the pattern generator 104 into an address (BFM_Address) that is provided to the block fail memory 40. Specifically, the BFM address formatter 14 formats the address from the pattern generator 104 to be an address of the block fail memory 40 such that the address corresponds to an address selecting a block obtained by dividing the memory under test 300, and outputs the address in this format. With this formatting function, the block fail memory 40 can be made to correspond to memories under test 300 with a variety of block address configurations.

The AFM address selector 16 switches the address signal to supply the address fail memory 30 with an address output from the AFM address formatter 12 during testing of the DUT and to supply the address fail memory 30 with an address from the analyzing section 20 during the fail repair analysis. The BFM address selector 18 switches the address signal to supply the block fail memory 40 with an address output from the BFM address formatter 14 during testing of the DUT and to supply the block fail memory 40 with an address from the analyzing section 20 during the fail repair analysis.

The fail analysis memory section 10 operates in the following manner during testing of the DUT. First, prior to testing of the DUT, the address fail memory 30 and the block fail memory 40 are cleared. When the DUT testing starts, the address signal indicating an address in the memory under test 300 and the write data are output from the pattern generator 104, and the data is written to the memory under test 300. When the written data is read from the memory under test 300, the address signal and the expected value data are output from the pattern generator 104, and the data read from the DUT is compared to the expected value data by the logical comparator 108. The fail analysis memory section 10 is supplied with the address signal from the pattern generator 104, and is also supplied with the fail signal indicating whether the cell of the read address is a fail from the logical comparator 108.

When the cell at the address designated by the address signal is a fail cell, a value of 1 is stored in the address fail memory 30 at the address designated by the AFM address formatter 12. When the cell at the address designated by the address signal is not a fail cell, nothing is stored in the address fail memory 30. In this way, the address fail memory 30 can store address fail data indicating whether a fail cell is present, for each address in the memory under test 300.

Furthermore, when the cell at the address designated by the address signal is a fail cell, a value of 1 is stored in the block fail memory 40 at the address designated by the BFM address formatter 14. When the cell at the address designated by the address signal is not a fail cell, nothing is stored in the block fail memory 40. In this way, the block fail memory 40 can store block fail data indicating whether a fail cell is present, for each block including a plurality of cells in the memory under test 300.

The fail analysis memory section 10 operates in the following manner during the fail repair analysis. The fail analysis memory section 10 receives, from the analyzing section 20, the address (AFM_Address) read from the address fail memory 30 and the address (BFM_Address) read from the block fail memory 40.

The address fail memory 30 outputs to the analyzing section 20 the address fail data corresponding to the address (AFM_Address) from the analyzing section 20. The block fail memory 40 outputs to the analyzing section 20 the block fail data corresponding to the block address (BFM_Address) from the analyzing section 20.

Figure 3:
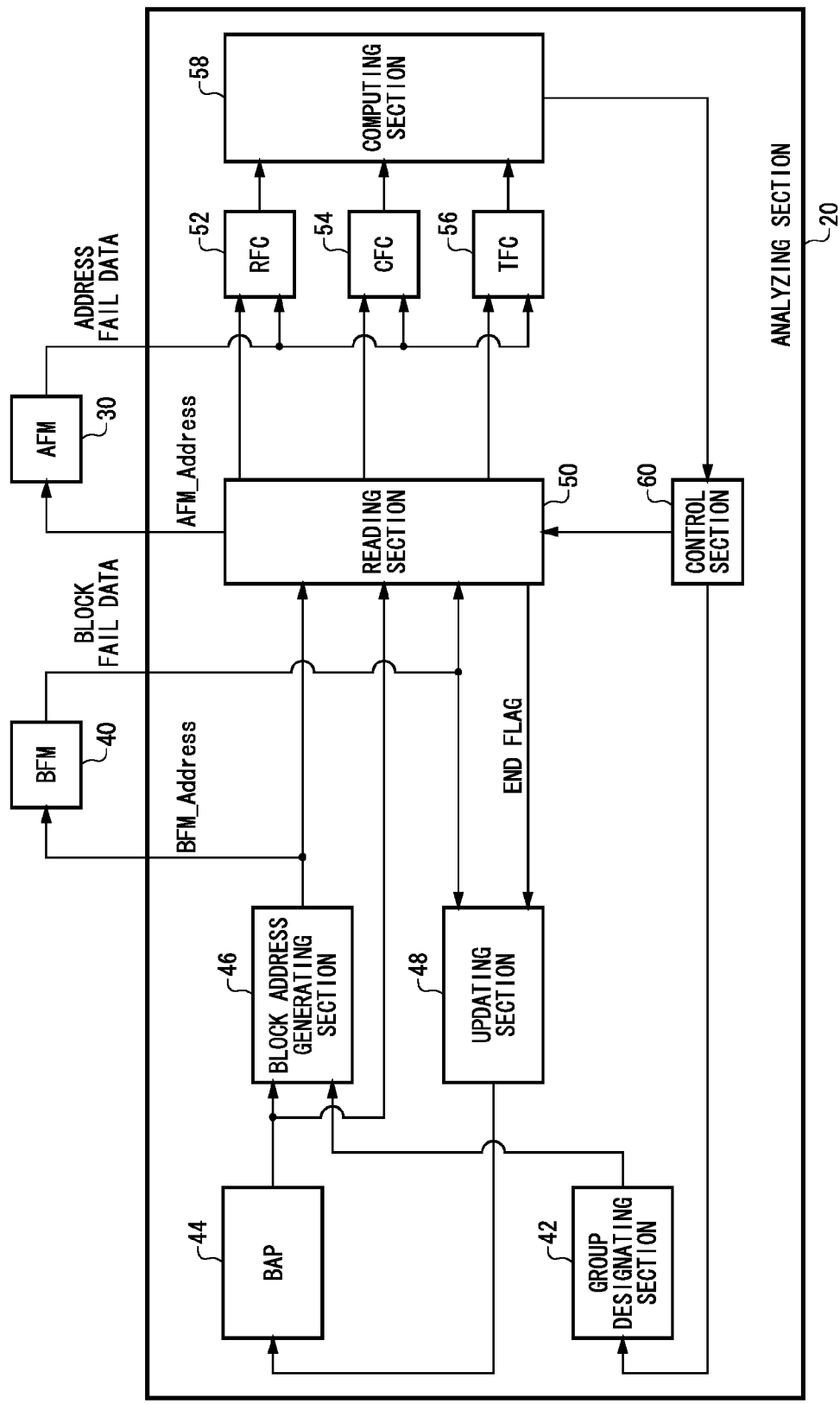
FIG. 3 shows an exemplary configuration of the analyzing section 20 according to the present embodiment, along with the address fail memory 30 and the block fail memory 40.

FIG. 3 shows an exemplary configuration of the analyzing section 20 according to the present embodiment, along with the address fail memory (AFM) 30 and the block fail memory (BFM) 40. The analyzing section 20 includes a group designating section 42, a block address pointer (BAP) 44, a block address generating section 46, an updating section 48, a reading section 50, a row fail counter (RFC) 52, a column fail counter (CFC) 54, a total fail counter (TFC) 56, a computing section 58, and a control section 60.

The group designating section 42 includes therein a register (Register_A) for designating groups on which the repair analysis is to be performed, and outputs values designating the groups. Here, each group is a collection of a plurality of blocks obtained by dividing the memory region in the memory under test 300. For example, if the memory under test 300 is divided into 256 blocks, each group may include 16 blocks. Each group may be a region designated by a portion of the upper bits in the block address designating the block within the memory under test 300, for example.

The group designating section 42 is a register that stores group values, and the values may be overwritten by the control section 60. Furthermore, the group designating section 42 is a counter that increments an initial value, such as 0, by 1 at a time.

The block address pointer (BAP) 44 sequentially generates block addresses in a group. The block addresses within a group are addresses that designate blocks in the group from which the address fail data is to be read. The block address pointer 44 may increment the initial value, such as 0, by 1 each time update instructions are received from the updating section 48, for example.

The block address generating section 46 combines the block address within the group generated by the block address pointer (BAP) 44 with the group value output by the group designating section 42, to generate the block address (BFM_Address) designating the block of the block fail memory 40 from which the block fail data is to be read. The block address generating section 46 may generate the block address (BFM_Address) by allocating the group value output by the group designating section 42 to the upper bits and allocating the block address within the group generated by the block address pointer (BAP) 44 to the lower bits, for example.

The block address generating section 46 supplies the block fail memory 40 with the generated block address (BFM_Address). In this way, the analyzing section 20 can read the block fail data from the block fail memory 40. Furthermore, the block address generating section 46 supplies the reading section 50 and the block fail memory 40 with the generated block address (BFM_Address).

The updating section 48 receives, from the block fail memory 40, the block fail data stored at the block address (BFM_Address) generated by the block address generating section 46. Furthermore, the updating section 48 receives, from the reading section 50, an end flag indicating that the address fail data has been read from all of the addresses within the one block designated by the block address generating section 46.

When the received block fail data does not indicate a fail, i.e. when there are no fail cells within the block designated by the block address generating section 46, the updating section 48 updates the intra-group block address by incrementing the block address pointer (BAP) 44. Furthermore, when the end flag is received from the reading section 50, the updating section 48 updates the intra-group block address by incrementing the block address pointer 44.

The reading section 50 reads the address fail data from the address fail memory 30 for each group in the memory under test 300. Specifically, the reading section 50 reads the address fail data by supplying the address fail memory 30 with the address (AFM_Address) sequentially designating cells in the designated block.

In the present embodiment, the reading section 50 receives the block address (BFM_Address) and block fail data. When the received block fail data indicates a fail, i.e. when there is a fail cell within the block designated by the block address generating section 46, the reading section 50 outputs addresses (AFM_Address) sequentially designating cells in the block designated by the received block address (BFM_Address). When the addresses of all the cells in the block have been output, the reading section 50 outputs an end flag.

Furthermore, the reading section 50 receives an intra-group block address. The reading section 50 internally generates an intra-block row address and an intra-block column address. The reading section 50 generates a row address from the intra-block row address and the intra-group block address, and supplies the generated row address to the row fail counter 52. Similarly, the reading section 50 generates a column address from an intra-block column address and an intra-group block address, and supplies the generated column address to the column fail counter 54.

The reading section 50 supplies the total fail counter 56 with the intra-group block address of a block that contains the address (AFM_Address) supplied to the address fail memory 30. An exemplary configuration of the reading section 50 is described in detail in FIG. 5.

The row fail counter (RFC) 52 counts the fail cells indicated by the address fail data read by the reading section 50, for each row address in each block within the group. An exemplary configuration of the row fail counter 52 is described in detail in FIG. 4.

The column fail counter (CFC) 54 counts the fail cells indicated by the address fail data read by the reading section 50, for each column address in each block within the group. An exemplary configuration of the column fail counter 54 is described in detail in FIG. 4.

The total fail counter (TFC) 56 counts the fail cells indicated by the address fail data read by the reading section 50, for each block in the group. An exemplary configuration of the total fail counter 56 is described in detail in FIG. 4.

The computing section 58 performs the repair analysis for electrically replacing the row and column address lines containing fail cells in each block within a group with spare lines, for each group. More specifically, the computing section 58 performs the repair analysis by searching for row or column address lines that include fail cells, based on the number of fail cells in each row address (RFC) in each block counted by the row fail counter 52, the number of fail cells in each column address (CFC) in each block counted by the column fail counter 54, and the total number of fail cells (TFC) in each block counted by the total fail counter 56.

After the computing section 58 finishes the repair analysis for one group, the control section 60 writes a group value indicating the next group on which the repair analysis is to be performed in the register (Register_A) of the group designating section 42. If the group designating section 42 is a counter, after the repair analysis for one group is finished, the control section 60 notifies the group designating section 42 that the repair analysis has ended. In this case, the group designating section 42 increments the group value upon receiving this notification. Furthermore, before the next repair analysis, the control section 60 sets the reading section 50 and other components to the initial settings, based on the number of row addresses and the number of column addresses in the block, for example.

Figure 4:
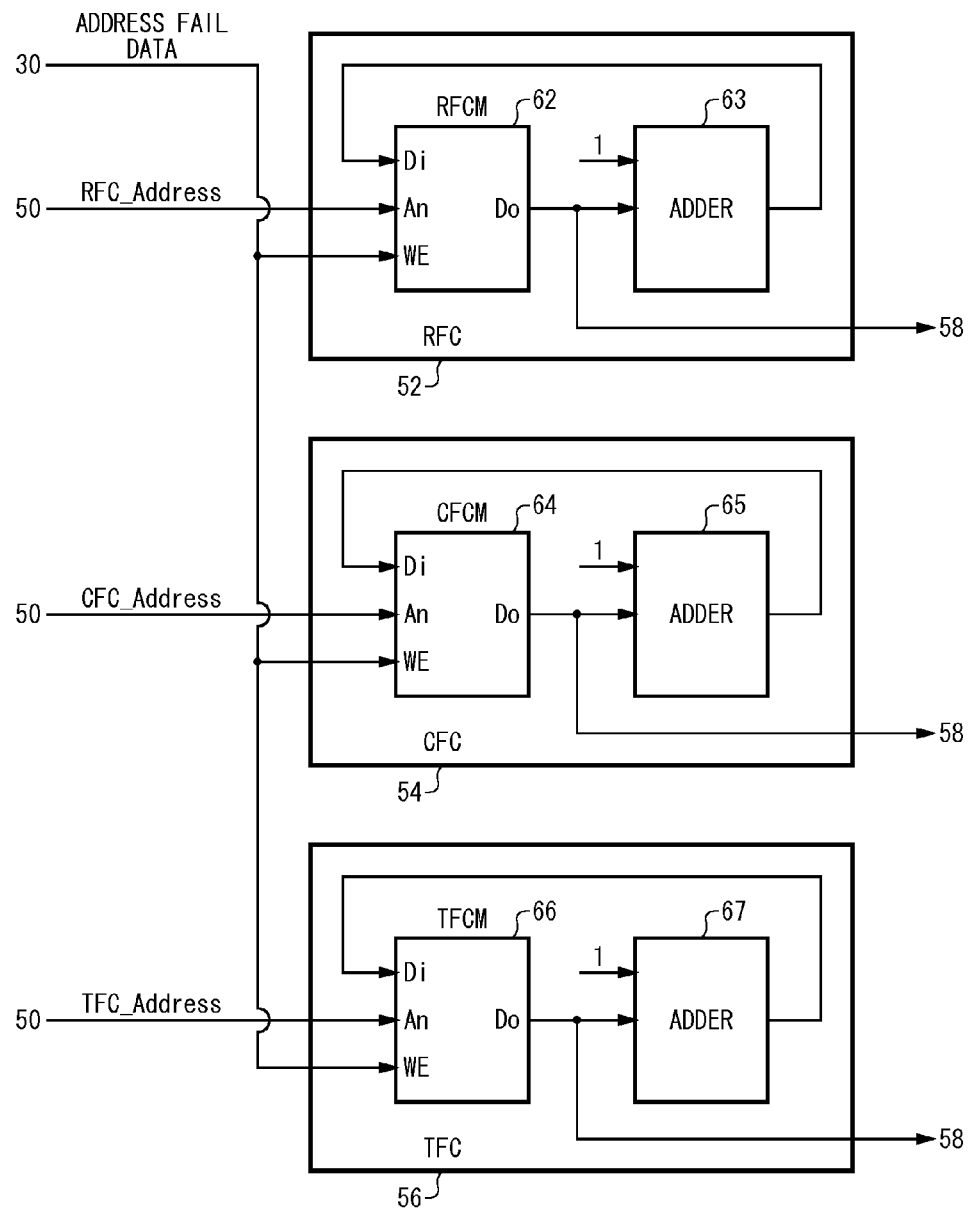
FIG. 4 shows exemplary configurations of the row fail counter 52, the column fail counter 54, and the total fail counter 56 according to the present embodiment.

FIG. 4 shows exemplary configurations of the row fail counter 52, the column fail counter 54, and the total fail counter 56 according to the present embodiment. The row fail counter 52 includes an RFC memory (RFCM) 62 and an adder 63.

The RFC memory 62 includes a storage region corresponding to the number of row address bits in each block of the group. The RFC memory 62 receives, at a write enable terminal thereof, the address fail data output from the address fail memory 30. The RFC memory 62 receives, at an address terminal thereof, a row address (RFC_Address) in the group.

The adder 63 reads the value from the storage region of the RFC memory 62 designated by the row address (RFC_Address), and outputs a value obtained by adding 1 to the read value. When the address fail data indicates a fail, e.g. when the address fail data has a value of 1, the RFC memory 62 writes the value output by the adder 63 to the storage region designated by the row address (RFC_Address). When the address fail data does not indicate a fail, the RFC memory 62 does not write the value output by the adder 63. The row fail counter 52 having this configuration can count the fail cells indicated by the address fail data read by the reading section 50 from the address fail memory 30, for each row address in each block of the group.

The column fail counter 54 includes a CFC memory (CFCM) 64 and an adder 65. The CFC memory 64 has a storage region corresponding to the number of column address bits in each block of the group. The CFC memory 64 receives, at a write enable terminal thereof, the address fail data output from the address fail memory 30. The CFC memory 64 receives, at an address terminal thereof, a column address (CFC_Address) in the group.

The adder 65 reads the value from the storage region of the CFC memory 64 designated by the column address (CFC_Address), and outputs a value obtained by adding 1 to the read value. When the address fail data indicates a fail, the CFC memory 64 writes the value output by the adder 65 to the storage region designated by the column address (CFC_Address). When the address fail data does not indicate a fail, the CFC memory 64 does not write the value output by the adder 65. The column fail counter 54 having this configuration can count the fail cells indicated by the address fail data read by the reading section 50 from the address fail memory 30, for each column address in each block of the group.

The total fail counter 56 includes a TFC memory (TFCM) 66 and an adder 67. The TFC memory 66 has at least a storage region corresponding to the number of blocks in the group. The TFC memory 66 receives, at a write enable terminal thereof, the address fail data output by the address fail memory 30. The TFC memory 66 receives, at an address terminal thereof, an intra-group block address (TFC_Address) designating a block in the group.

The adder 67 reads the value from the storage region of the TFC memory 66 designated by the intra-group block address (TFC_Address), and outputs a value obtained by adding 1 to the read value. When the address fail data indicates a fail cell, the TFC memory 66 writes the value output by the adder 67 to the storage region designated by the intra-group block address. When the address fail data does not indicate a fail cell, the TFC memory 66 does not write the value output by the adder 67. The total fail counter 56 having this configuration can count the fail cells indicated by the address fail data read by the reading section 50 from the address fail memory 30, for each block in the group.

Figure 5:
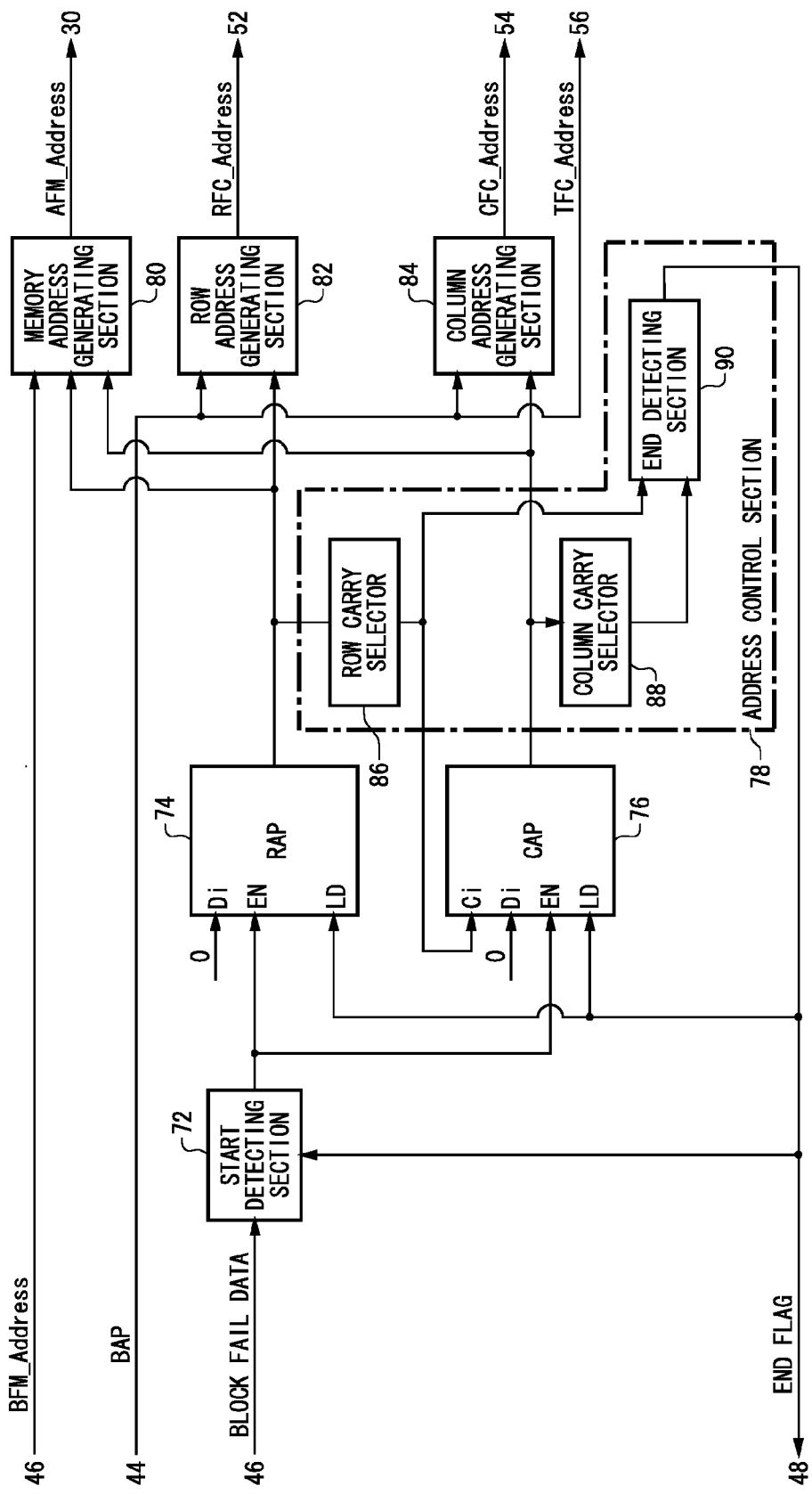
FIG. 5 shows an exemplary configuration of the reading section 50 according to the present invention.

FIG. 5 shows an exemplary configuration of the reading section 50 according to the present invention. The reading section 50 includes a start detecting section 72, a row address pointer (RAP) 74, a column address pointer (CAP) 76, an address control section 78, a memory address generating section 80, a row address generating section 82, and a column address generating section 84.

The start detecting section 72 controls the operation time of the row address pointer 74 and the column address pointer 76. More specifically, the start detecting section 72 causes the row address pointer 74 and the column address pointer 76 to operate from when the block fail data is received from the block fail memory 40 to when an end flag is received from the end detecting section 90.

The row address pointer (RAP) 74 generates a row address in the block. The row address pointer 74 may be a counter that generates each row address in the block both cyclically and sequentially, from the first to the last.

Upon receiving the end flag, the row address pointer 74 may load a value indicating the first row address in the block, such as a value of 0, as the counter value. While an enable signal is being received from the start detecting section 72, the row address pointer 74 increments the count value for each block. When the count value is a value indicating the last row address in the block, the row address pointer 74 transmits a carry signal to the column address pointer 76 and returns the counter value at the next clock to a value indicating the first row address in the block.

The column address pointer (CAP) 76 generates a column address in the block. The column address pointer 76 may be a counter that generates each column address in the block sequentially, from the first to the last.

Upon receiving the end flag, the column address pointer 76 may load a value indicating the first column address in the block, such as a value of 0, as the counter value. While an enable signal is being received from the start detecting section 72, the row address pointer 74 increments the count value for each carry from the row address pointer 74, each time the count value of the row address pointer 74 returns to the first row address in the block.

The address control section 78 controls the operation of the row address pointer 74 and the column address pointer 76. More specifically, the address control section 78 causes the row address pointer 74 and the column address pointer 76 to sequentially output combinations of a row address and a column address designating all of the addresses within the block, according to the number of row address and the number of column addresses within the block.

The address control section 78 includes a row carry selector 86, a column carry selector 88, and the end detecting section 90, for example. The maximum value of the row address pointer 74, i.e. the number of row addresses in one block, is set in the row carry selector 86. When the count value of the row address pointer 74 is the maximum value, the row carry selector 86 transmits a carry signal. The carry signal causes the column address pointer 76 to increment the count value. After the row address pointer 74 reaches the set maximum value, the value returns to the initial value.

The maximum value of the column address pointer 76, i.e. the number of column addresses in one block, is set in the column carry selector 88. When the count value of the column address pointer 76 is the maximum value, the column carry selector 88 transmits a carry signal. The end detecting section 90 outputs an end flag at the timing at which the carry signals are transmitted from both the row carry selector 86 and the column carry selector 88. Specifically, the end detecting section 90 outputs the end flag when the value of the row address pointer 74 reaches the final row address in the block and the value of the column address pointer 76 reaches the final column address in the block. Furthermore, after the column address pointer 76 reaches the set maximum value, the value returns to the initial value.

The end flag is supplied to the start detecting section 72. As a result, the start detecting section 72 can cause the row address pointer 74 and the column address pointer 76 to stop the count operations when the count value of the row address pointer 74 has reached the final row address and the count value of the column address pointer 76 has reached the final column address.

The end flag is also supplied to the updating section 48. As a result, the updating section 48 can update to the value of the next block by incrementing the value of the block address pointer 44.

The memory address generating section 80 receives a block address (BFM_Address) from the block address generating section 46, a row address from the row address pointer 74, and a column address from the column address pointer 76. The memory address generating section 80 combines the column address, the row address, and the block address including a group value, to generate the address (AFM_Address) at which the address fail data is to be read from the address fail memory 30.

The row address generating section 82 receives the intra-group block address from the block address pointer 44 and receives the row address from the row address pointer 74. The row address generating section 82 combines these addresses to generate the address (RFC_Address) to be supplied to the row fail counter 52.

The column address generating section 84 receives the intra-group block address from the block address pointer 44 and the column address from the column address pointer 76. The column address generating section 84 combines these addresses to generate the address (CFC_Address) to be supplied to the column fail counter 54.

Furthermore, the reading section 50 supplies the received intra-group block address (TFC_Address) to the total fail counter 56.

With this configuration, the reading section 50 can read the address fail data from the address fail memory 30 for each block. Furthermore, the reading section 50 can output an end flag when the output from the addresses in all cells of a block is finished. Yet further, the reading section 50 can generate addresses to be supplied to the row fail counter 52, the column fail counter 54, and the total fail counter 56.

FIG. 6 shows exemplary addresses supplies to the address fail memory 30 and the block fail memory 40 during testing of the DUT. The address fail memory 30 and the block fail memory 40 are supplied with addresses from the pattern generator 104 during testing of the DUT.

In this example, the address fail memory 30 is supplied with a 12-bit X address (X0 to X11) and a 12-bit Y address (Y0 to Y11). The block fail memory 40 is supplied with addresses that are the same as the upper bits of the X address and Y address of the address fail memory 30. In the present example, the block fail memory 40 is supplied with a 5-bit X address (X7 to X11) and a 5-bit Y address (Y7 to Y11).

Figure 7:
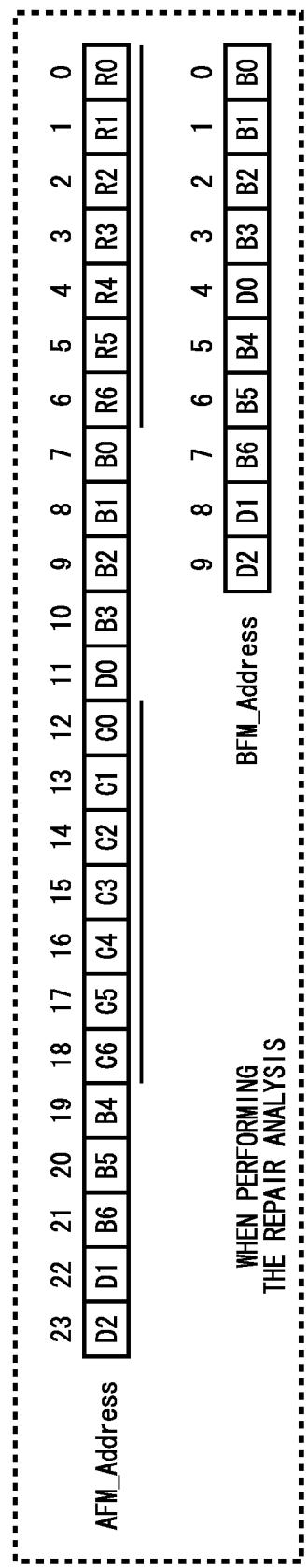
FIG. 7 shows exemplary addresses supplied to the address fail memory 30 and the block fail memory 40 during the repair analysis.

FIG. 7 shows exemplary addresses supplied to the address fail memory 30 and the block fail memory 40 during the repair analysis. The address fail memory 30 and the block fail memory 40 are supplied with addresses from the analyzing section 20 during the repair analysis.

The configurations of the addresses supplied from the analyzing sections 20 are the same as the configurations of the addresses supplied from the pattern generator 104 during testing of the DUT. In the present example, the address fail memory 30 is supplied by the analyzing section 20 with addresses corresponding to the 12-bit X address and the 12-bit Y address used when testing. Here, R0 to R6 represent bits 0 to 6 of the row address pointer (RAP) 74, C0 to C6 represent bits 0 to 6 of the column address pointer (CAP) 76, B0 to B6 represent bits 0 to 6 of the block address pointer (BAP) 44, and D0 to D2 represent bits 0 to 2 of data indicating the group value. In the same manner, the block fail memory 40 is supplied with the 5-bit X address and the 5-bit Y address from the analyzing section 20.

In other words, in this setting example, the address configuration of the memory under test 300 is such that there are a total of 16 million address bits represented by 24 bits (0 to 23), there are a total of 1024 blocks represented by 10-bit addresses (B0 to B6+D0 to D2), there are 8 groups represented by 3-bit addresses (D0 to D2), there are 128 blocks in each group represented by 7-bit addresses (B0 to B6), there are 128 million row addresses in each block represented by 7-bit addresses (R0 to R6), and there are 128 million column addresses in each block represented by 7-bit addresses (C0 to C6).

The correspondence between the 12 bits of the X address and the 12 bits of the Y address used during testing is correlated with FIG. 6. For example, the bit X0, which is bit number 0 in the X address during testing, corresponds to R0, which is bit number 0 in the row address during analysis.

FIG. 8 shows an exemplary setting when there are 7 row address bits and 7 column address bits in a block. Before performing the repair analysis, the control section 60 sets the effective bit width of the row address pointer (RAP) 74 and the effective bit width of the column address pointer (CAP) 76, according to the number of row address bits and the number of column address bits in one block of the memory under test 300.

When there are 7 row address bits and 7 column address bits in the block, 7 bits (R0 to R6) are set as the effective row addresses transmitted from the row address pointer 74 and 7 bits (C0 to C6) are set as the effective column addresses transmitted from the column address pointer 76. The bits shown in the shaded portions in the drawings are unused bits, and the bits that are not in the shaded portions are effective bits.

The control section 60 may set the lower 7 bits in each of the row carry selector 86 and the column carry selector 88 to have a value of 1, and set a value of 0 in the remaining bits. In this case, the row carry selector 86 and the column carry selector 88 respectively generate the carry signals by determining whether the row address value or the column address value matches the set value.

Next, the control section 60 sets the effective bit width of the block address pointer (BAP) that generates the intra-group block address, according to the bit width of the addresses of the CFC memory 64 in the column fail counter 54 and the RFC memory 62 in the row fail counter 52. More specifically, the effective bit width of the block address pointer (BAP) is set to be whichever value is smaller among a value obtained by subtracting the number of row address bits in the block from the bit width of the address (RFC_Address) of the RFC memory 62 and a value obtained by subtracting the number of column address bits in the block from the bit-width of the address (CFC_Address) of the CFC memory 64.

In the present example, the address (RFC_Address) of the RFC memory 62 and the address (CFC_Address) of the CFC memory 64 each have a bit width of 14 bits and there are 7 row address bits and 7 column address bits in the block, and therefore the effective bit width of the block address pointer (BAP) is set to be 7 bits (B0 to B6).

Next, the control section 60 sets the effective bit width of the register (Register_A) designating the group, based on the bit width of the block address (BFM_Address) designating a block in the memory under test 300 and the effective bit width of the block address pointer (BAP) generating the intra-group block address. Specifically, a number of bits obtained by subtracting the number of bits of the block address pointer from the number of bits of the block address is the effective bit width for the group value that can be set in the register (Register_A).

In the present example, the block address (BFM_Address) has a bit width of 10 bits. Accordingly, in the present example, the register (Register_A) for designating the group has an effective bit width of 3 bits (D0 to D2).

By setting the effective bit widths of the various address functions in the manner described above, the analyzing section 20 can generate an address (AFM_Address) at which address fail data is to be read from the address fail memory 30 and an address (BFM_Address) from which block fail data is to be read from the block fail memory 40. Furthermore, the analyzing section 20 can generate an address (RFC_Address) to be supplied to the RFC memory 62 of the row fail counter 52 and an address (CFC_Address) to be supplied to the CFC memory 64 of the column fail counter 54.

FIG. 9 shows an exemplary setting when there are 6 row address bits and 6 column address bits in a block. When there are 6 row address bits and 6 column address bits in the block, the control section 60 sets 6 bits (R0 to R5) as the effective row addresses of the row address pointer (RAP) 74 and 6 bits (C0 to C5) as the effective column addresses of the column address pointer (CAP) 76.

Furthermore, the control section 60 sets the effective bit width of the block address pointer (BAP) 44 to be 8 bits (B0 to B7). The effective bit width of the register (Register_A) is set to be 2 bits (D0 and D1).

Figure 10:
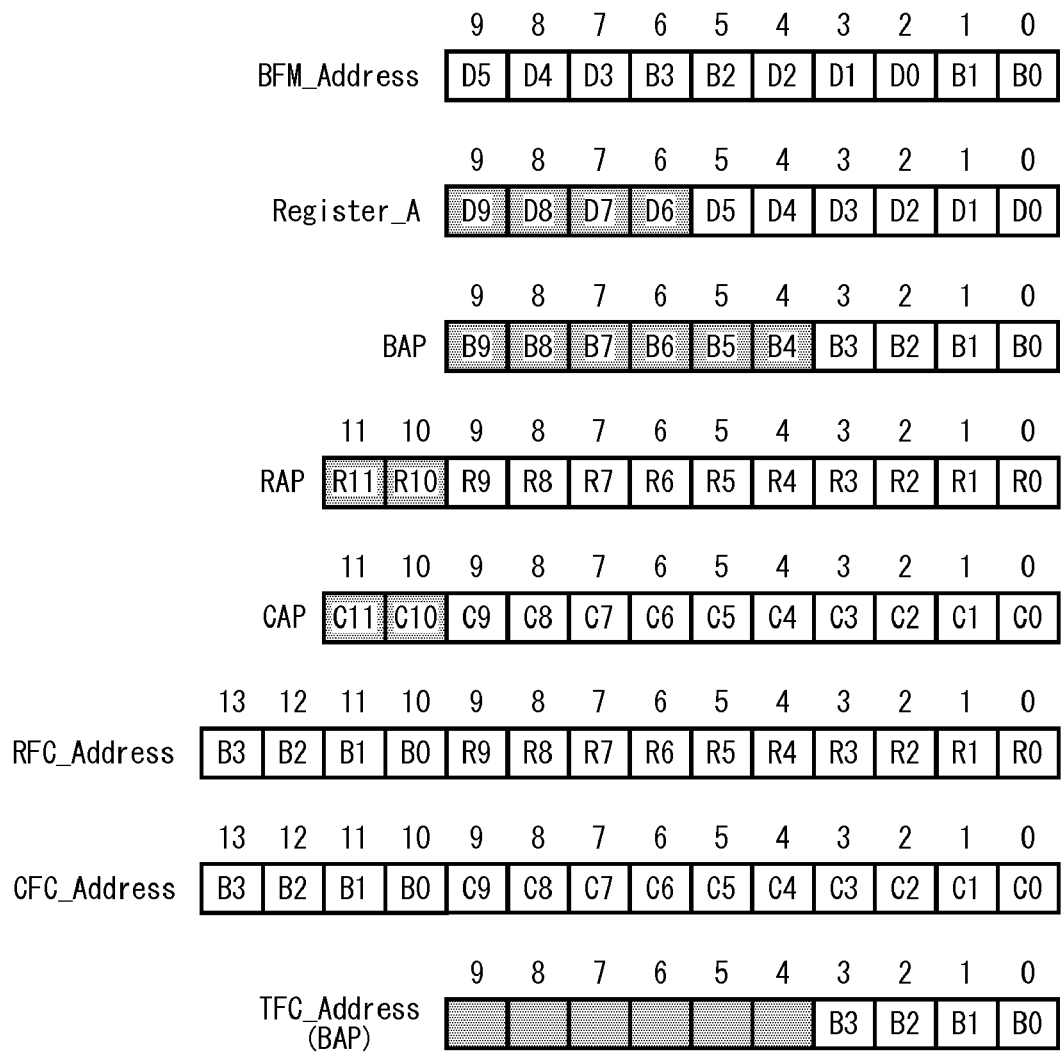
FIG. 10 shows an exemplary setting when there are 10 row address bits and 10 column address bits in a block.

FIG. 10 shows an exemplary setting when there are 10 row address bits and 10 column address bits in a block. When there are 10 row address bits and 10 column address bits in the block, the control section 60 sets 10 bits (R0 to R9) as the effective row addresses of the row address pointer (RAP) and 10 bits (C0 to C9) as the effective column addresses of the column address pointer (CAP) 76.

Furthermore, the control section 60 sets the effective bit width of the block address pointer (BAP) 44 to be 4 bits (B0 to B3). The effective bit width of the register (Register_A) is set to be 6 bits (D0 to D5).

Even when the number of cells in each block and the capacity of the memory under test 300 changes as described above, the settings can also be changed as appropriate. Accordingly, even when the capacity of the memory under test 300 is increased, the fail analysis memory section 10 of the present embodiment can perform the fail repair analysis without increasing the capacity of the memory for storing the number of fail cells. Furthermore, since the capacity of the memory for storing the number of fail cells need not be increased when the capacity of the memory under test 300 increases, the fail analysis memory section 10 can reduce the capacity of the memory for storing the number of fail cells, thereby decreasing the cost.

Figure 11:
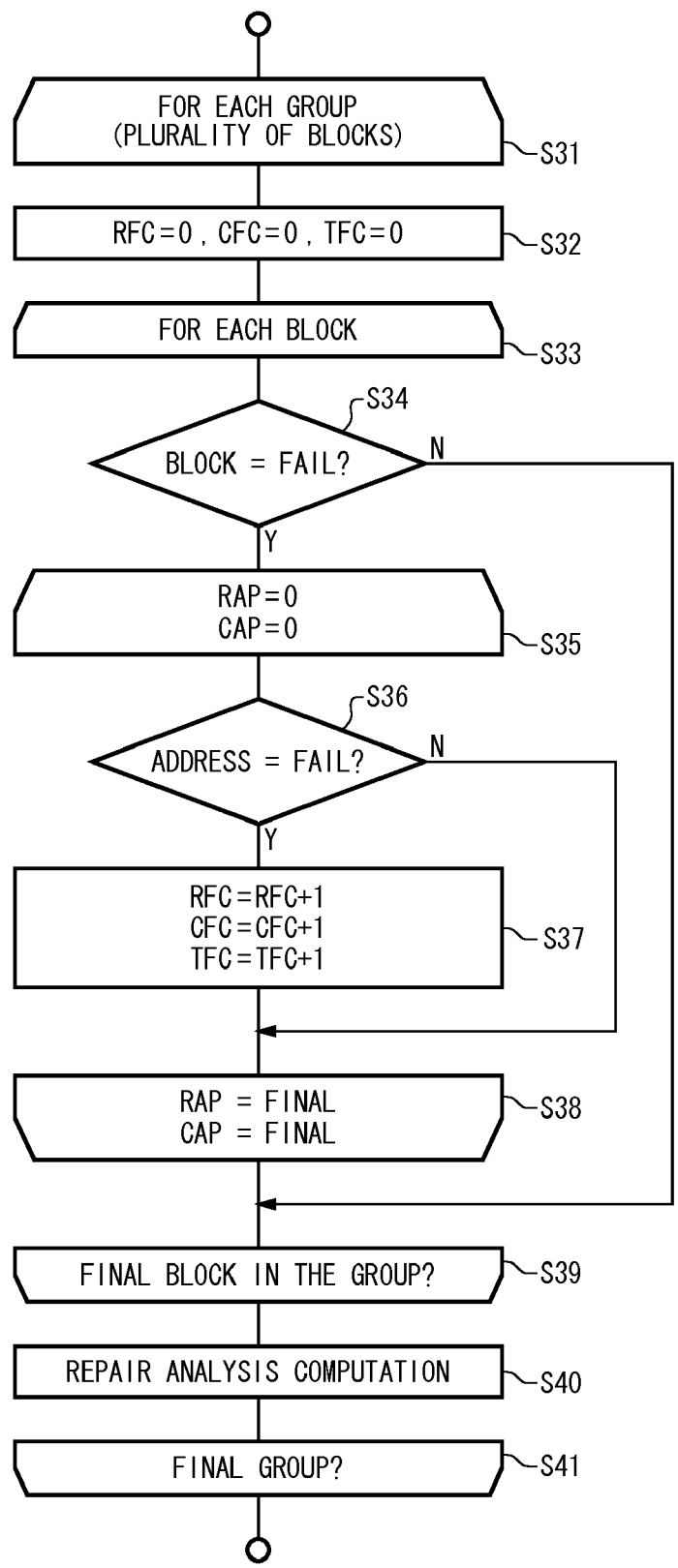
FIG. 11 shows an exemplary process flow of the analyzing section 20.

FIG. 11 shows an exemplary process flow of the analyzing section 20. During the fail repair analysis process, the analyzing section 20 performs steps S31 to S41 described below.

First, the analyzing section 20 performs the processes of step S32 to step S40 for each group, i.e. each set of a plurality of blocks within memory under test 300 (S31, S41). Next, in the processing for each group, the analyzing section 20 initializes the number of fail cells (RFC) for each row address in each block of the group, the number of fail cells (CFC) for each column address in each block of the group, and the number of fail cells (TFC) for each block in the group to each have a value of 0.

Next, in the processing of each group, the analyzing section 20 performs the processes of step S34 to step S38 for each block in the group (S33, S39).

Next, in the processing of each block, the analyzing section 20 reads the block fail data of the block from the block fail memory 40 and determines whether a fail cell is present in the block (S34). When there are no fail cells present in the block (the "No" of S34), the analyzing section 20 proceeds to step S39. When there is a fail cell present in the block (the "Yes" of S34), the analyzing section 20 proceeds to step S35.

Next, in the processing of each block, the analyzing section 20 increments the row address pointer from 0 to the maximum value of the effective bit width, generates a carry signal when the maximum value is reached, and then returns the value to 0 in the next cycle. Along with this, the analyzing section 20 increments the column address pointer each time a carry signal is transmitted from the row address pointer, from 0 to the maximum value of the effective bit width (S35, S38).

Next, the analyzing section 20 reads the address fail data from the address fail memory at an address designated by the column address and the row address from the address fail memory 30, and judges whether there is a fail cell at the address (S36). When there are no fail cells at the address (the "No" of S36), the processing proceeds to step S38. When there is a fail cell at the address (the "Yes" of S36), the analyzing section 20 proceeds to step S37.

At step S37, the analyzing section 20 increments the number of fail cells (RFC) corresponding to the row address in the block by 1. Furthermore, the analyzing section 20 increments the number of fail cells (CFC) corresponding to the column address in the block by 1. Yet further, the analyzing section 20 increments the number of fail cells (TFC) within the block by 1.

Next, at step S38, the analyzing section 20 returns to step S36 if the row address is not the final row address in the block and the column address is not the final column address in the block.

Next, at step S39, the analyzing section 20 returns to step S34 if the block is not the final block in the group. Furthermore, the analyzing section 20 proceeds to step S40 if the block is the final block in the group.

Next, at step S40, the analyzing section 20 calculates the repair solution for repairing the fail cells in the group, based on the number of fail cells (RFC) for each row address in each block of the group, the number of fail cells (CFC) for each column address in each block of the group, and the number of fail cells (TFC) for each block in the group. At step S41, the analyzing section 20 returns to step S32 if the group is not the final group in the memory under test 300, and ends the fail repair analysis if the group is the final group in the memory under test 300.

The memory under test 300 stores a plurality of bits of data, e.g. 16 bits or 32 bits, for one address. In this case, the analyzing section 20 may include a plurality of row fail counters 52, a plurality of column fail counters 54, and a plurality of total fail counters 56 corresponding to the number of bits that form one piece of data stored in the memory under test 300.

Furthermore, in this case, the reading section 50 reads the multi-bit data from the address fail memory 30 and counts the number of fail cells among the corresponding bits in the row fail counters 52, the column fail counters 54, and the total fail counters 56. This analyzing section 20 can be provided along with the reading section 50 in common for a plurality of bits, and therefore the circuit size can be decreased.

Yet further, in this case, there is no need to increase the circuit size of the block fail memory 40 if the AND of the multi-bit data is stored in the block fail memory 40 during testing as 1 bit of block fail data.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a memory under test, comprising:
    an address fail memory that, for each address in the memory under test, stores address fail data indicating whether a fail cell is contained at the address;
    a block fail memory that, for each block including a plurality of cells of the memory under test, stores block fail data indicating whether a fail cell is contained in the block;
    a reading section that, for each block in the memory under test, reads the address fail data from the address fail memory;
    a row fail counter that, for each row address in a group including a plurality of the blocks in the memory under test, counts the fail cells indicated by the address fail data read by the reading section; and
    a column fail counter that, for each column address in the group, counts the fails cells indicated by the address fail data read by the reading section.

2. The test apparatus according to claim 1, further comprising a total fail counter that, for each block in the group, counts the fail cells indicated by the address fail data read by the reading section.

3. The test apparatus according to claim 1, further comprising a computing section that, for each group, performs a repair analysis of the memory under test based on the number of fail cells counted by the row fail counter and the number of fail cells counted by the column fail counter.

4. The test apparatus according to claim 1, further comprising:
    a group designating section that outputs a group value designating a group on which a repair analysis is to be performed;
    an intra-group block address generating section that sequentially generates intra-group block addresses designating blocks in the group from which the block fail data is to be read; and
    a block address generating section that combines a group value and an intra-group block address to generate a block address designating a block from which the block fail data is to be read from the block fail memory.

5. The test apparatus according to claim 4, wherein the reading section includes:
    a row address generating section that designates a row address in a block;
    a column address generating section that designates a column address in a block;
    an address control section that causes combinations of a row address and a column address designating all of the addresses in a block to be sequentially output from the row address generating section and the column address generating section, according to the number of row addresses and the number of column addresses in the block; and
    a memory address generating section that combines a block address, a row address, and a column address to generate an address at which the address fail data is to be read from the address fail memory.

6. The test apparatus according to claim 5, wherein the reading section further includes:
    a row address generating section that combines an intra-group block address and a row address to generate an address to be supplied to the row fail counter; and
    a column address generating section that combines an intra-group block address and a column address to generate an address to be supplied to the column fail counter.

7. The test apparatus according to claim 5, further comprising a control section that sets in the address control section the number of row addresses and the number of column addresses in one block.

8. The test apparatus according to claim 4, wherein
    the group designating section is a register that stores the group values, and
    the test apparatus further comprises a control section that, after the repair analysis has been performed for a group, writes to the group designating section a group value indicating the next group for which the repair analysis is to be performed.

9. The test apparatus according to claim 4, wherein
    the group designating section is a counter that stores the group value and increments the group value every time the repair analysis is performed for one group.

10. The test apparatus according to claim 1, further comprising a plurality of the row fail counters and a plurality of the column fail counters corresponding to a plurality of bits forming one piece of data stored in the memory under test, wherein
    the reading section designates addresses in common for the address fail memory and causes the row fail counters and the column fail counters to each count the number of fail cells among the corresponding bits.

11. A repair analysis method for a memory under test performed by a test apparatus that tests the memory under test, wherein
    the test apparatus includes:
        an address fail memory that, for each address in the memory under test, stores address fail data indicating whether a fail cell is contained at the address; and a block fail memory that, for each block including a plurality of cells of the memory under test, stores block fail data indicating whether a fail cell is contained in the block, for each block in the memory under test, the test apparatus reads the address fail data from the address fail memory, for each row address in a group including a plurality of the blocks in the memory under test, the test apparatus counts the fail cells indicated by the read address fail data, for each column address in the group, the test apparatus counts the fails cells indicated by the read address fail data, and the test apparatus performs the repair analysis of the memory under test for each group, based on the results of counting the fail cells.

* * * * *